(12) United States Patent
Takamiya et al.

(10) Patent No.: US 9,974,216 B2
(45) Date of Patent: May 15, 2018

(54) DIE SUPPLY APPARATUS (71) Applicant: FUJI MACHINE MFG. CO., LTD., Chiryu (JP)

(72) Inventors: Hideyasu Takamiya, Chiryu (JP); Yukinori Nakayama, Hekinan (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days. days.

(21) Appl. No.: 14/765,063

(22) PCT Filed: Jan. 31, 2013

(86) PCT No.: PCT/JP2013/052162
§ 371 (c)(1),
(2) Date: Jul. 31, 2015

(87) PCT Pub. No.: WO2014/118929
PCT Pub. Date: Aug. 7, 2014

(65) Prior Publication Data
US 2015/0382520 A1    Dec. 31, 2015

(51) Int. Cl.
*H01L 21/67* (2006.01)
*H05K 13/00* (2006.01)
(Continued)

(52) U.S. Cl.
CPC ... *H05K 13/0061* (2013.01); *H01L 21/67144* (2013.01); *H01L 24/75* (2013.01); *H05K 13/043* (2013.01); *H01L 2224/7565* (2013.01)

(58) Field of Classification Search
CPC .......... H01L 21/67144; H05K 13/0061; H05K 13/043
(Continued)

(56) References Cited

U.S. PATENT DOCUMENTS 5,232,143 A    8/1993  Buxton
5,519,980 A *  5/1996  Guentert ................... B65B 1/16
                                                         141/67
(Continued)

FOREIGN PATENT DOCUMENTS

CN    100356540 C    12/2007
JP    2003-273167 A   9/2003
(Continued)

OTHER PUBLICATIONS

International Search Report dated Mar. 5, 2013, in PCT/JP2013/052162, filed Jan. 31, 2013.
(Continued)

*Primary Examiner* — Anna M Momper
*Assistant Examiner* — Ronald Jarrett
(74) *Attorney, Agent, or Firm* — Oblon, McClelland, Maier & Neustadt, L.L.P.

(57) ABSTRACT

A supply head of a die supply apparatus is detachably held by a head holding unit of a head moving mechanism. The supply head held by the head holding unit is replaceable with a supply head having the same number of nozzles as the number of nozzles of a mounting head of a component mounting machine. A nozzle arrangement of the supply head of the die supply apparatus has the same arrangement as a nozzle arrangement of the mounting head of the component mounting machine.

6 Claims, 12 Drawing Sheets

(51) Int. Cl.
*H05K 13/04* (2006.01)
*H01L 23/00* (2006.01)

(58) Field of Classification Search
USPC .......................................... 414/787
See application file for complete search history.

(56) References Cited

U.S. PATENT DOCUMENTS

| | | | | |
|---|---|---|---|---|
| 5,839,187 | A | * 11/1998 | Sato | ................. H01L 21/67144 29/743 |
| 2003/0177633 | A1 | * 9/2003 | Haji | ................. H01L 21/67144 29/743 |
| 2010/0229378 | A1 | 9/2010 | Uchino et al. | |
| 2010/0257727 | A1 | 10/2010 | Hiraki | |
| 2012/0279660 | A1 | 11/2012 | Chan et al. | |

FOREIGN PATENT DOCUMENTS

| | | |
|---|---|---|
| JP | 2006-261325 A | 9/2006 |
| JP | 2010-87446 A | 4/2010 |
| JP | 2010-129949 A | 6/2010 |

OTHER PUBLICATIONS

Extended European Search Report dated Aug. 30, 2016 in Patent Application No. 13873777.0.
Office Action dated Aug. 1, 2016 in Japanese Patent Application No. 2014-559424 (submitting English translation only).
Chinese Office Action issued in Chinese Patent Application No. 201380071608.7 dated May 16, 2017 (w/ English Translation).

* cited by examiner

DIE SUPPLY APPARATUS

TECHNICAL FIELD

The present disclosure relates to a die supply apparatus in which a die formed by dicing a wafer attached on a dicing sheet is suctioned by a suction nozzle so as to be supplied to a component mounting machine.

BACKGROUND ART

Recently, PTL 1 (JP-A-2010-129949) discloses that a die supply apparatus supplying dies is set to a component mounting machine and the component mounting machine mounts the dies on a circuit board. The die supply apparatus includes a wafer pallet on which, attached in an expanded state, is an elastic dicing sheet with a wafer that is diced so as to be divided into a plurality of the dies, and a push-up pin which is arranged below the dicing sheet. When the die on the dicing sheet is suctioned and picked up by lowering a nozzle of a supply head, a portion in the dicing sheet attached with a die to be suctioned is pushed up by using the push-up pin so as to cause the attachment portion of the die to partially separate from the dicing sheet, and the die is suctioned by the nozzle so as to be picked from the dicing sheet.

CITATION LIST

Patent Literature

PTL 1: JP-A-2010-129949

SUMMARY

Technical Problem

There are a direct delivery method and a shuttle delivery method as methods for delivering a die from a die supply apparatus to a component mounting machine.

In the direct delivery method, in a state where the die is suctioned by a nozzle of the supply head of the die supply apparatus, a supply head is inverted upside down by an upside-down inverting mechanism, and the die on the nozzle of the supply head is suctioned by a nozzle of a mounting head of the component mounting machine.

Meanwhile, in the shuttle delivery method, the die suctioned by the nozzle of the supply head of the die supply apparatus is placed on a shuttle mechanism, and the shuttle mechanism transfers the die to a die delivery position at which the die is suctionable by the nozzle of the mounting head of the component mounting machine. Then, the die is suctioned by the nozzle of the mounting head of the component mounting machine at the die delivery position.

The number of nozzles of the mounting head of the component mounting machine is not fixed, and there is a component mounting machine having a different number of nozzles. Moreover, there is a component mounting machine in which the mounting head is replaceable with a mounting head having a different number of nozzles. Since the supply head of the die supply apparatus set to the aforementioned component mounting machines is not configured to be replaceable, there is a case where the number of nozzles of the supply head of the die supply apparatus does not coincide with the number of nozzles of the mounting head of the component mounting machine. In such a case, the numbers of dies suctionable between the supply head of the die supply apparatus and the mounting head of the component mounting machine do not coincide with each other. Therefore, the dies cannot be efficiently delivered from the die supply apparatus to the component mounting machine, thereby degrading tact time in production.

The problem to be solved by the present disclosure is that the dies can be efficiently delivered from the die supply apparatus to the component mounting machine.

Solution to Problem

In order to solve the above-described problem, according to the present disclosure, there is provided a die supply apparatus which supplies a die suctioned by a nozzle to a component mounting machine. The die supply apparatus includes a supply head that holds the nozzle suctioning the die which is formed by dicing a wafer attached on a dicing sheet, and a head moving mechanism that moves the supply head. The supply head is detachably held by a head holding unit which is moved by the head moving mechanism, and the supply head held by the head holding unit is configured to be replaceable with a supply head which has the same number of nozzles as the number of nozzles of a mounting head of the component mounting machine. In the configuration, the supply head held by the head holding unit of the die supply apparatus is replaceable with a supply head which has the same number of nozzles as the number of nozzles of the mounting head of the component mounting machine. Therefore, the numbers of suctionable dies can coincide with each other by causing the numbers of nozzles between the supply head of the die supply apparatus and the mounting head of the component mounting machine to coincide with each other, and the die can be efficiently delivered from the die supply apparatus to the component mounting machine, thereby improving tact time in production.

When the present disclosure is provided, a method to deliver the die from the die supply apparatus to the component mounting machine may be any one of a direct delivery method and a shuttle delivery method.

When the present disclosure is applied to the die supply apparatus adopting the direct delivery method, the die supply apparatus may be provided with an upside-down inverting mechanism which inverts the supply head upside down. The supply head in which the die is suctioned by the nozzle may be configured to be inverted upside down by the upside-down inverting mechanism, and the die on the nozzle of the supply head may be suctioned by the nozzle of the mounting head of the component mounting machine. By a nozzle arrangement of the supply head of the die supply apparatus being the same arrangement as the nozzle arrangement of the mounting head of the component mounting machine, a plurality of the dies which are respectively suctioned by a plurality of the nozzles of the supply head of the die supply apparatus may be configured to be able to be simultaneously suctioned by a plurality of nozzles of the mounting head of the component mounting machine. In this manner, the plurality of dies suctioned by the plurality of nozzles of the supply head of the die supply apparatus adopting the direct delivery method can be simultaneously delivered to the plurality of nozzles of the mounting head of the component mounting machine, and thus, the dies can be efficiently delivered from the die supply apparatus adopting the direct delivery method to the component mounting machine.

Meanwhile, when the present disclosure is applied to the die supply apparatus adopting the shuttle delivery method, there may be provided the shuttle mechanism which receives the die suctioned by the nozzle of the supply head of the die supply apparatus and transfers the die to a die delivery position so as to be suctionable by the nozzle of the mounting head of the component mounting machine. The shuttle mechanism may be configured to transfer the plurality of dies so that a die arrangement at the die delivery position is the same arrangement as the nozzle arrangement of the mounting head of the component mounting machine, and the plurality of dies may be simultaneously suctioned by the plurality of nozzles of the mounting head of the component mounting machine at the die delivery position. In this manner, the plurality of dies moved by the plurality of nozzles of the supply head of the die supply apparatus adopting the shuttle delivery method to the shuttle mechanism can be transferred to the die delivery position, and the plurality of dies can be simultaneously suctioned by the plurality of nozzles of the mounting head of the component mounting machine at the die delivery position. Thus, the dies can be efficiently delivered from the die supply apparatus adopting the shuttle delivery method to the component mounting machine.

According to the present disclosure, the supply head of the die supply apparatus may be configured to be manually replaced by a worker, or the supply head may be automatically replaced.

When the supply head is automatically replaced, the configuration may include a head placement portion in which a supply head for replacement is placed, and a control device which controls the operations of the head moving mechanism so as to cause the supply head on the head placement portion to be held by the head holding unit. In this manner, the supply head of the die supply apparatus can be automatically replaced.

DESCRIPTION OF EMBODIMENT

Hereinafter, descriptions will be given regarding two Examples 1 and 2 in which aspects for realizing the present disclosure are given.

Example 1

Descriptions will be given regarding Example 1 in which the present disclosure is embodied by being applied to a die supply apparatus adopting a direct delivery method, with reference to FIGS. 1 to 11.

Figure 1:
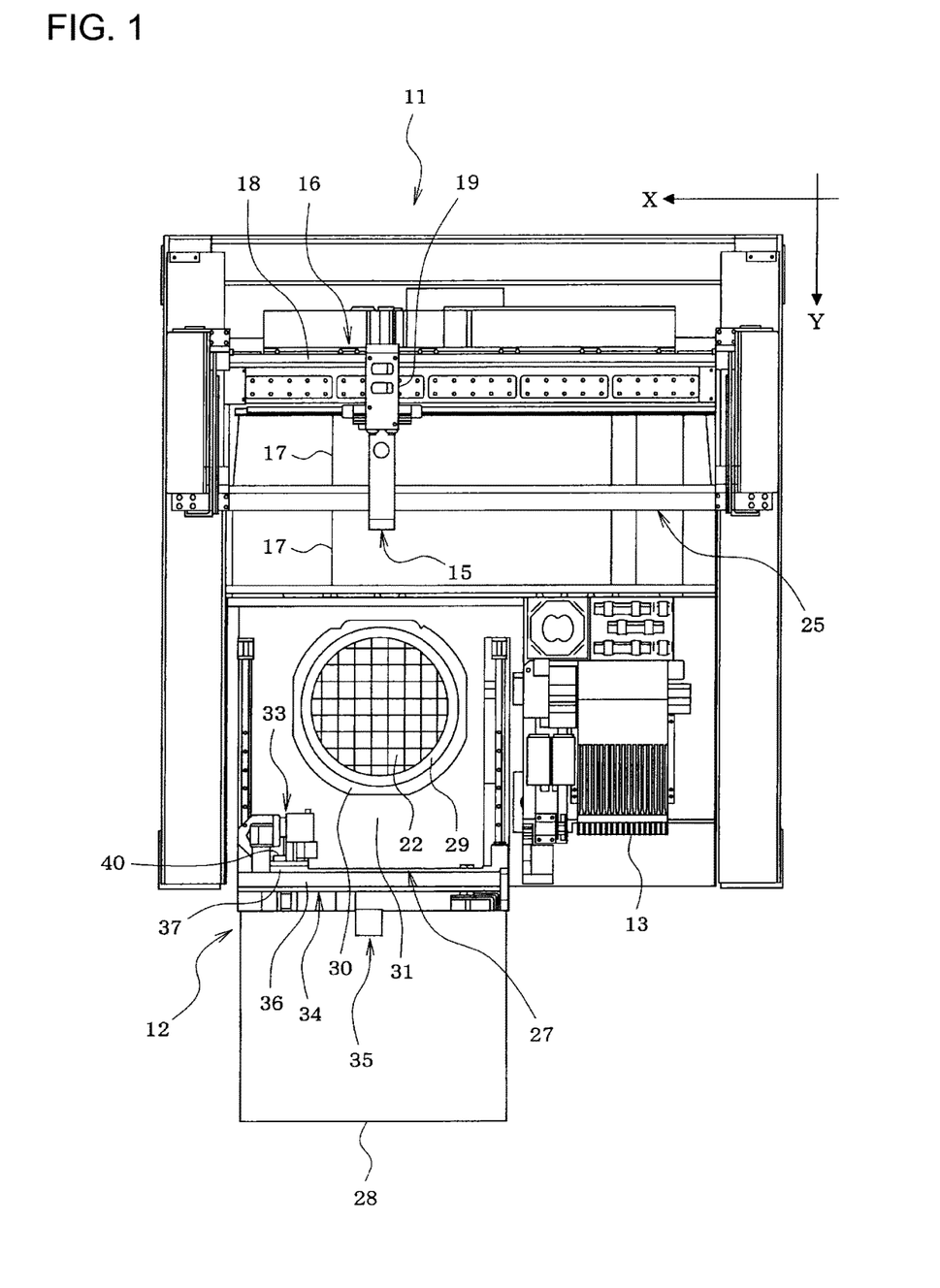
FIG. 1 is a plan view illustrating a state where a die supply apparatus is set in a component mounting machine of Example 1 of the present disclosure.
Figure 2:
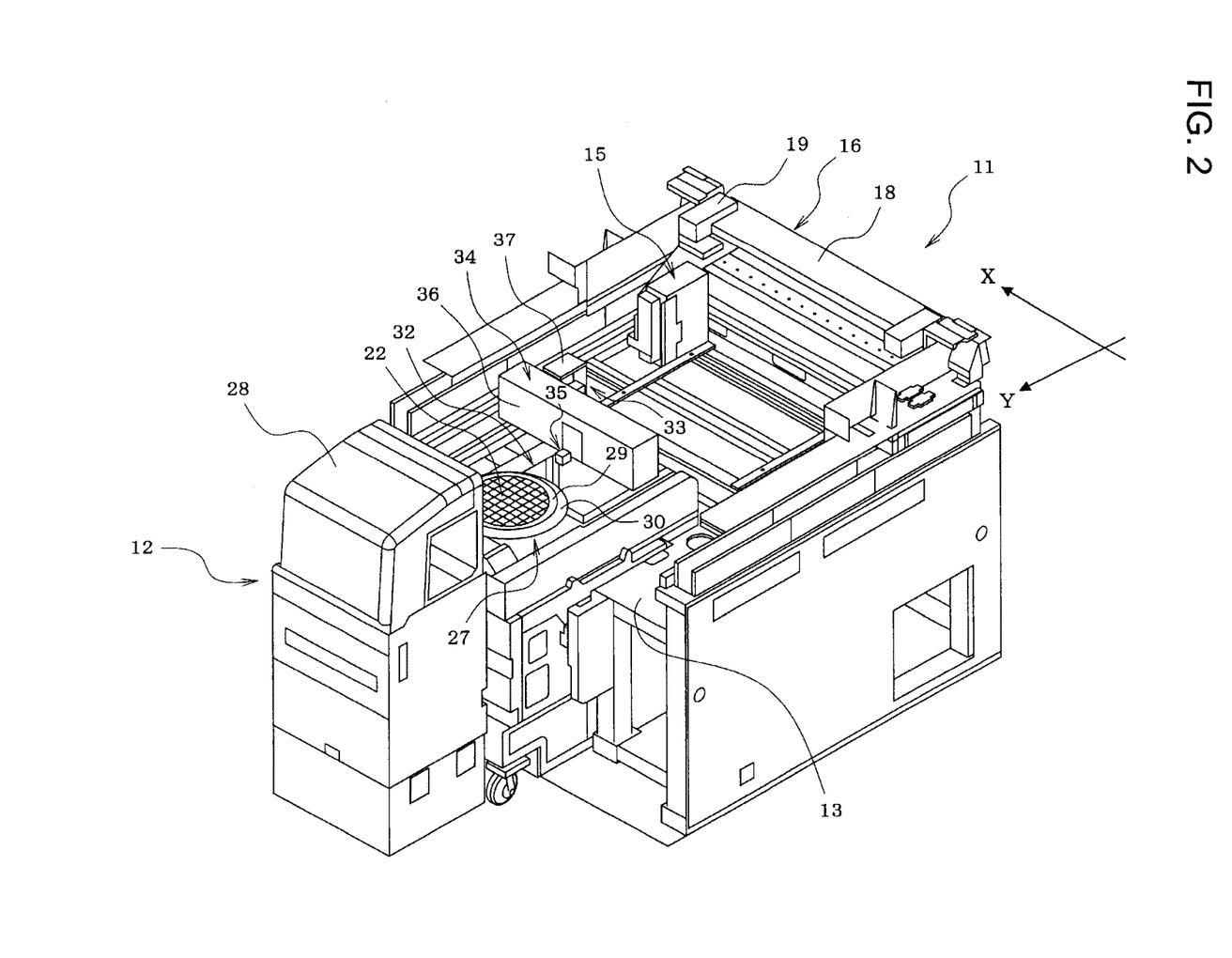
FIG. 2 is a perspective view of the appearance illustrating a state where a die supply apparatus is set in the component mounting machine.
Figure 3:
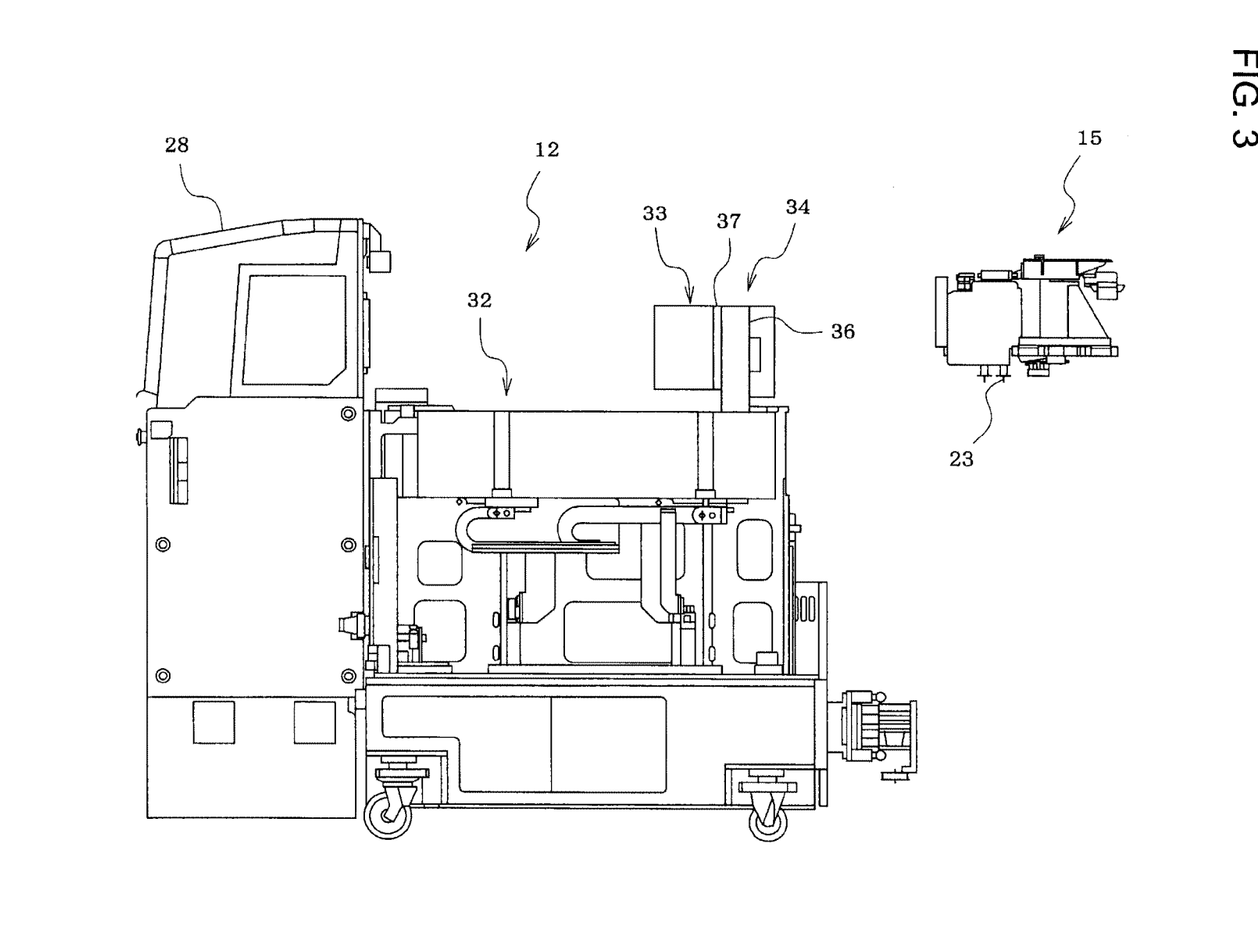
FIG. 3 is a side view illustrating a positional relationship between the die supply apparatus and a mounting head of the component mounting machine when the die supply apparatus is set in the component mounting machine.
Figure 4:
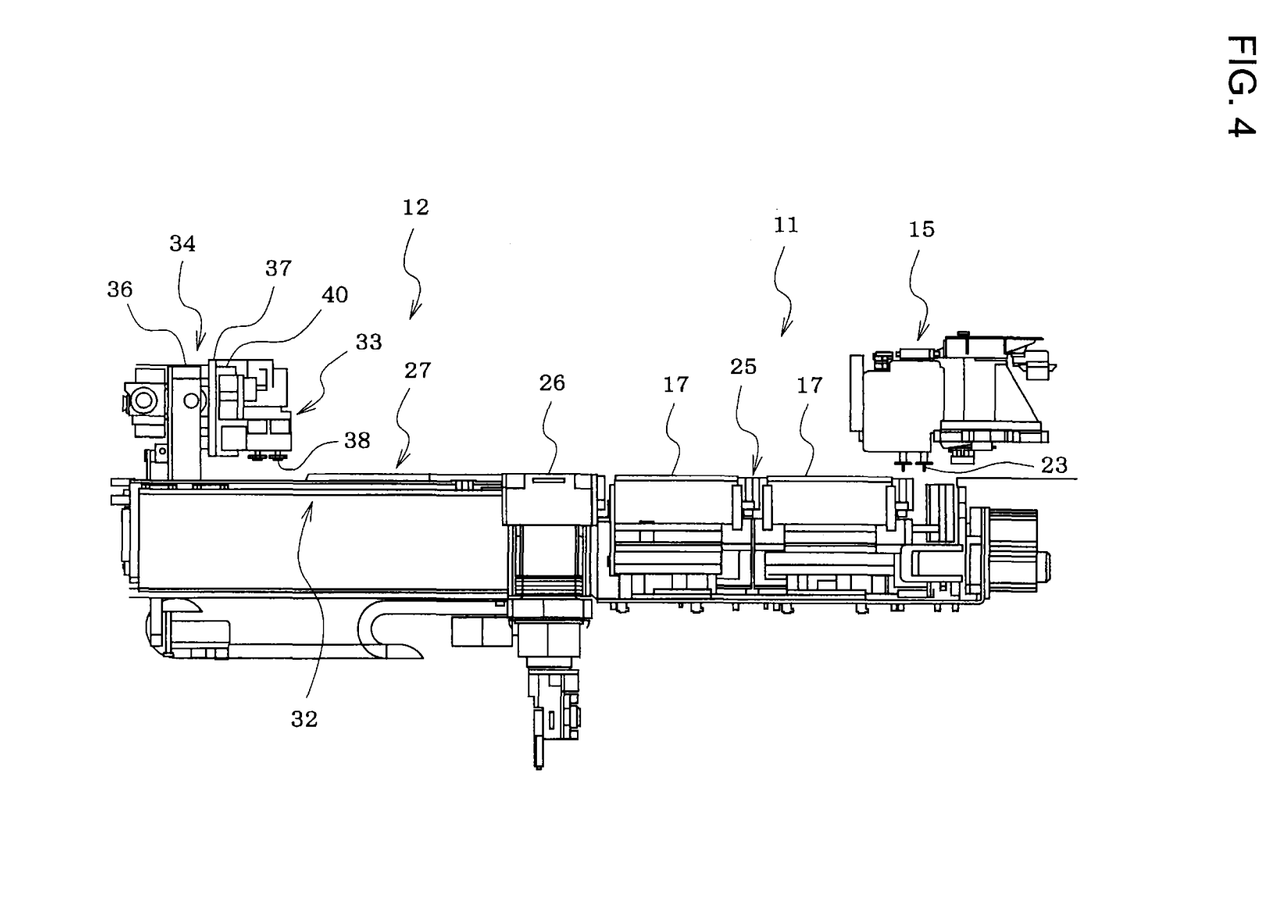
FIG. 4 is a side view illustrating a positional relationship in height between a supply head and the mounting head of the component mounting machine when a stage of the die supply apparatus is lifted.

As illustrated in FIGS. 1 and 2, a die supply apparatus 12 is detachably set in a component mounting machine 11. In the component mounting machine 11, a feeder setting table 13 is provided adjacent to a set position of the die supply apparatus 12, and a feeder (not illustrated) such as a tape feeder is detachably set on the feeder setting table 13. The feeder set on the feeder setting table 13 is not limited to the tape feeder. The feeder may be a bulk feeder, a stick feeder, and the like, and multiple types of the feeders among thereof may be set on the feeder setting table 13.

The component mounting machine 11 is provided with an XY moving mechanism 16 (an XY robot) moving a mounting head 15 in XY-directions (right-left and front-rear directions). The XY moving mechanism 16 includes a Y slide 18 which slides in a Y-direction (a direction perpendicular to a conveyance direction of a circuit board 17) and an X slide 19 which is slidably supported by the Y slide 18 in an X-direction (the conveyance direction of the circuit board 17). The mounting head 15 is supported by the X slide 19.

The mounting head 15 of the component mounting machine 11 is provided with one or a plurality of suction nozzles 23 (refer to FIGS. 3 to 8) which suction a die 22 supplied from the die supply apparatus 12 or an electronic component (hereinafter, referred to as "a feeder component") supplied from the feeder, a mark camera (not illustrated) which images an imaging target such as a fiducial mark of the circuit board from above, and the like. The mounting head 15 is exchangeable with a mounting head having a different number of the suction nozzle 23.

The component mounting machine 11 is provided with two conveyors 25 which convey the circuit board 17. A component camera 26 (refer to FIGS. 3 to 8) is provided so as to face upward at a position between the conveyors 25 and the die supply apparatus 12 (or the feeder) and images the die 22 or the feeder component suctioned by the suction nozzle 23 of the mounting head 15 from below.

Figure 10:
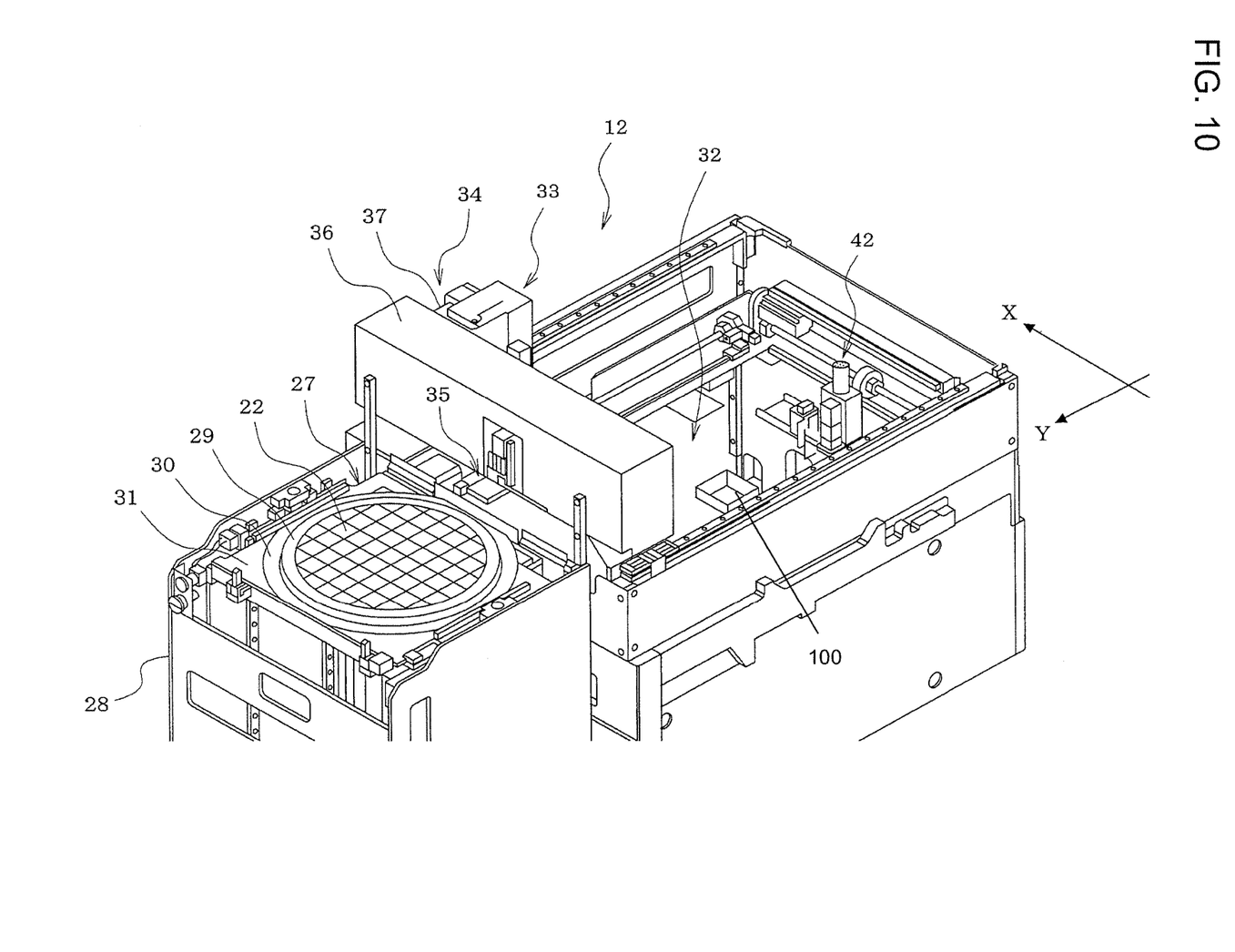
FIG. 10 is a perspective view of the appearance when a state of the wafer pallet which is not drawn out from a magazine of the die supply apparatus onto the stage is seen obliquely from above.
Figure 11:
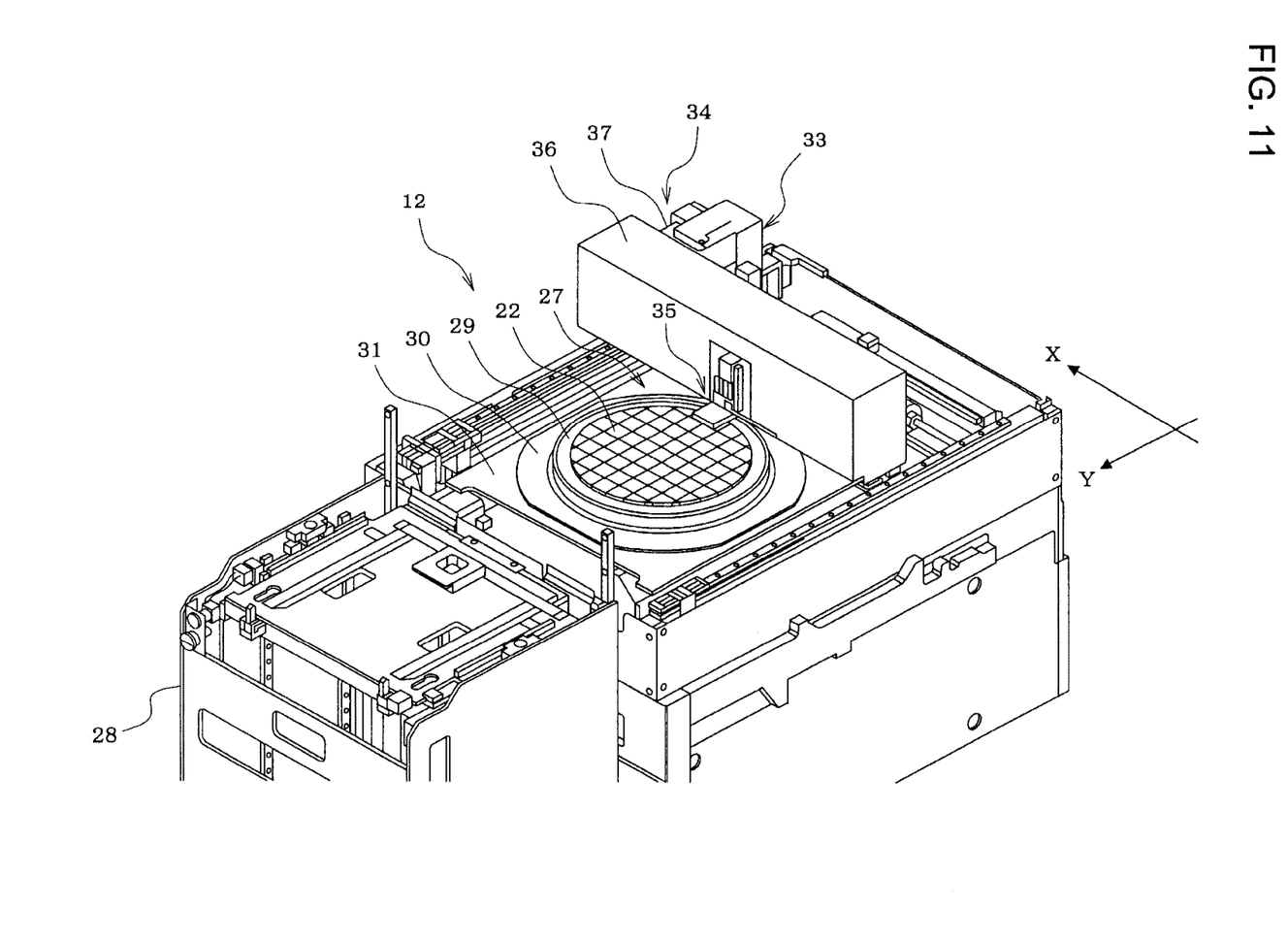
FIG. 11 is a perspective view of the appearance when a state of the wafer pallet which is drawn out from the magazine of the die supply apparatus onto the stage is seen obliquely from above.

Meanwhile, the die supply apparatus 12 is provided with a magazine 28 which accommodates wafer pallets 27 in a plurality of levels. As illustrated in FIGS. 10 and 11, in the wafer pallet 27, an elastic dicing sheet 29 attached with a wafer which is diced so as to be divided into multiple dies 22 is configured to be mounted in a dicing frame 30 including a circular opening portion in an expanded state, and the dicing frame 30 is installed in a pallet main body 31 by screwing or the like. The die supply apparatus 12 is provided with a drawing-out mechanism 35 which draws out the wafer pallet 27 from the magazine 28 onto a stage 32.

The die supply apparatus 12 is provided with a head moving mechanism 34 (the XY robot) which moves a supply head 33 in the XY-direction (the right-left and front-rear directions). The head moving mechanism 34 includes a Y slide 36 which slides in the Y-direction, and an X slide 37 which is supported by the Y slide 36 so as to be slidable in the X-direction. The supply head 33 is detachably held by a head holding unit 40 which is provided on the X slide 37. One or plurality of suction nozzles 38 (refer to FIG. 9) are held by the supply head 33 so as to be vertically movable. The supply head 33 of the die supply apparatus 12 is configured to be used when the die 22 is attached onto the dicing sheet 29 of the wafer pallet 27 with the mounting surface facing upward. After the die 22 is suctioned by the suction nozzle 38 of the supply head 33, the supply head 33 is inverted upside down by an upside-down inverting mechanism 39 (refer to FIG. 9), thereby inverting the die 22 upside down so as to be suctioned by the suction nozzle 23 of the mounting head 15 of the component mounting machine 11.

Figure 7:
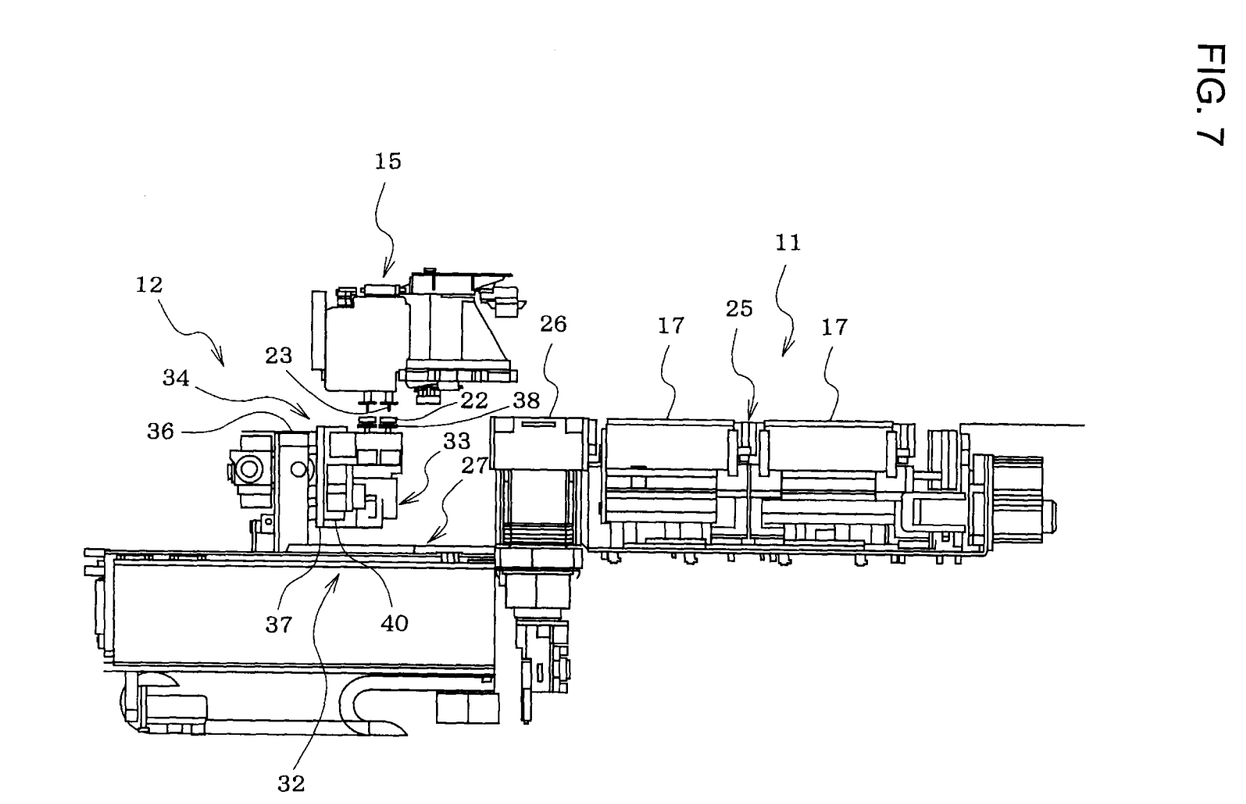
FIG. 7 is a side view illustrating a state occurring when the die on the supply head which is inverted upside down is suctioned by the mounting head of the component mounting machine.

In this case, since the height position of the die 22 on the supply head 33 which is inverted upside down needs to be adjusted to the suction height position of the mounting head 15 of the component mounting machine 11, there is provided an up-down moving mechanism (not illustrated) which causes the supply head 33 of the die supply apparatus 12 to move upward and downward integrally with the stage 32 in which the wafer pallet 27 is set. When the die 22 is inverted upside down so as to be mounted on the circuit board 17, the die 22 on the supply head 33 which is inverted upside down at a position where the supply head 33 and the stage 32 are lowered by the up-down moving mechanism is suctioned by the mounting head 15 of the component mounting machine 11, as illustrated in FIG. 7.

Figure 8:
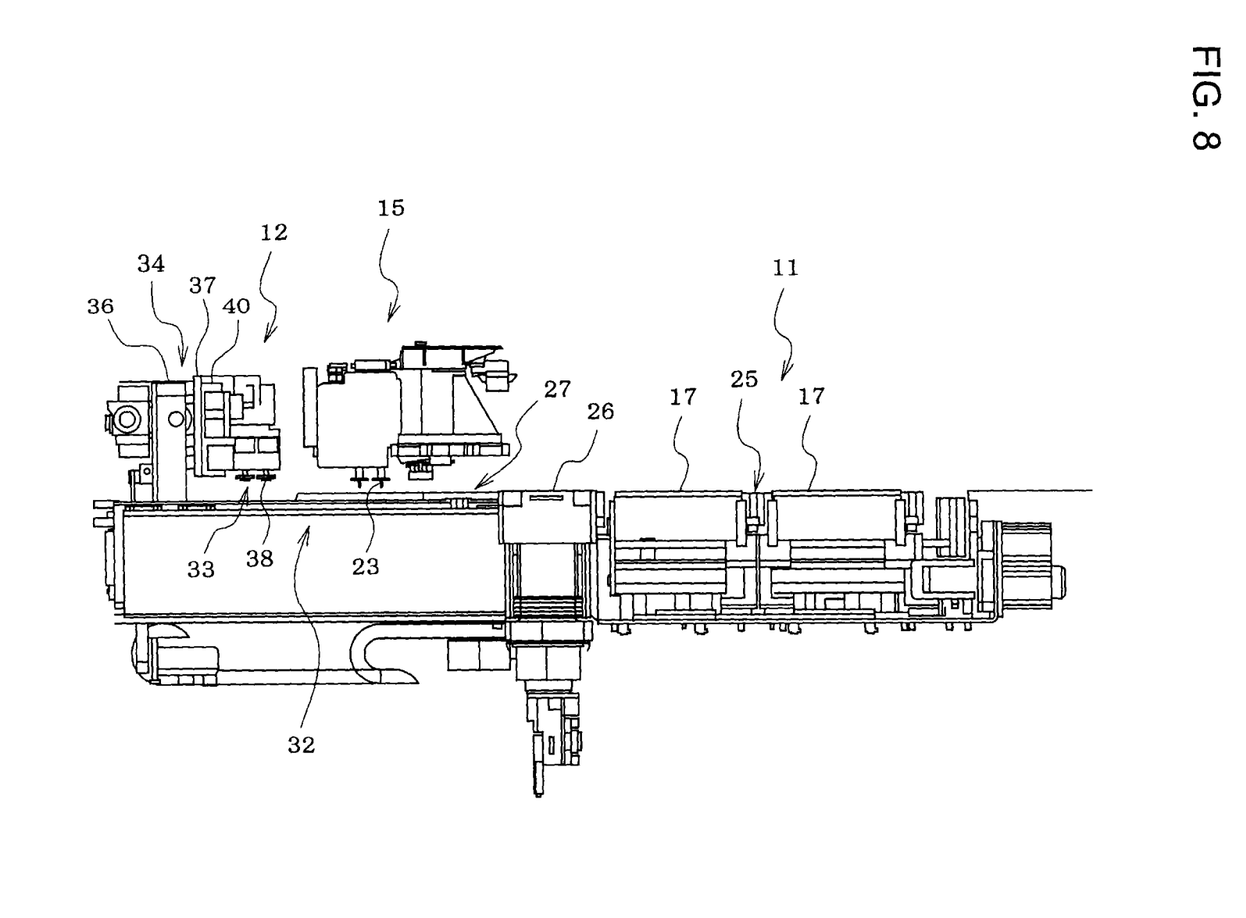
FIG. 8 is a side view illustrating a state occurring when the die of the wafer pallet on the stage of the die supply apparatus is directly suctioned by the mounting head of the component mounting machine.
Figure 9:
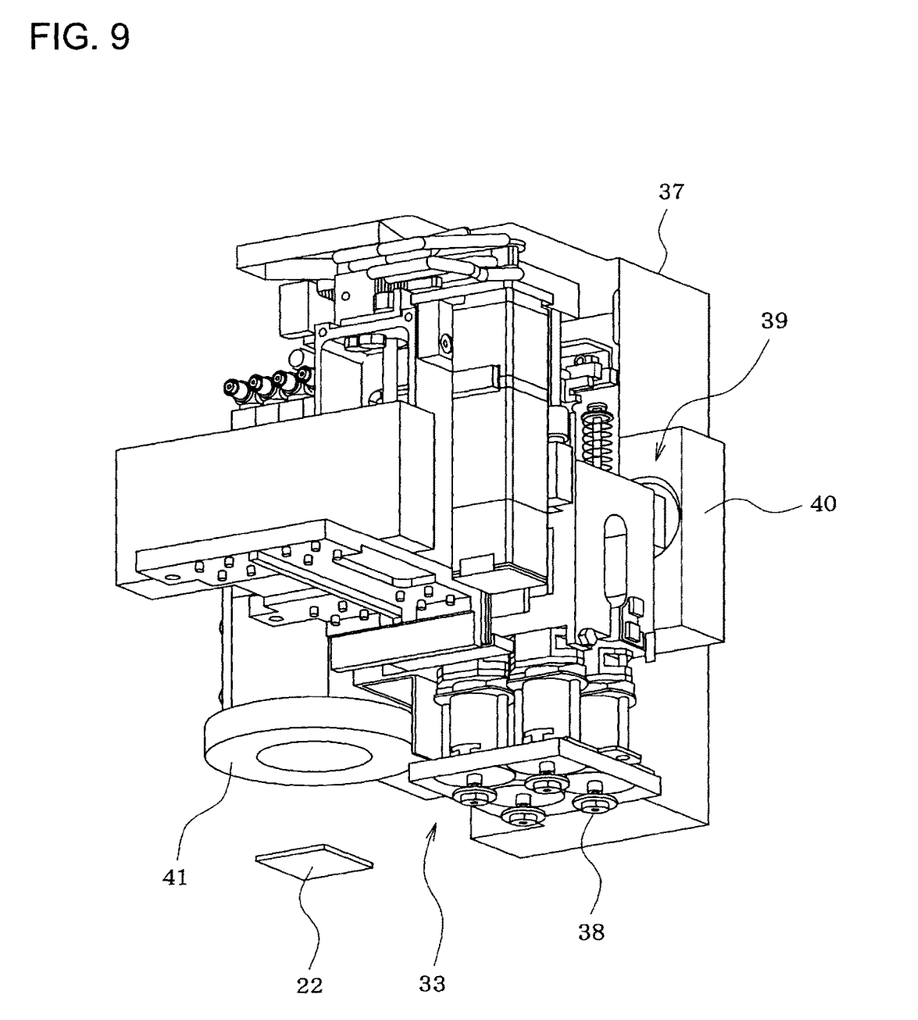
FIG. 9 is a perspective view of the appearance when the supply head of the die supply apparatus is seen obliquely from below.

Meanwhile, when the die 22 is attached onto the dicing sheet 29 of the wafer pallet 27 with the mounting surface facing downward, the die 22 is mounted on the circuit board 17 without being inverted upside down. In this case, as illustrated in FIG. 8, the die 22 of the wafer pallet 27 on the stage 32 is suctioned by the suction nozzle 23 of the mounting head 15 of the component mounting machine 11 at a position where the supply head 33 and the stage 32 are lifted by the up-down moving mechanism.

The supply head 33 of the die supply apparatus 12 is provided with a camera 41 (refer to FIG. 9) which images the die 22 before the die 22 is suctioned by the suction nozzle 38 of the supply head 33. An image captured by the camera 41 is processed so as to recognize the position of the die 22, and then, the die 22 is suctioned by the suction nozzle 38 of the supply head 33. Moreover, when the position of the die 22 is recognized based on a processed result of the image captured by the camera 41, it is determined whether or not the die 22 is a defective product. If the die 22 is determined to be a defective product, the procedure proceeds to the image processing step for an adjacent die 22 without suctioning the die 22.

The die supply apparatus 12 is provided with a protrusion 42 (refer to FIG. 10) which pushes up a portion of the dicing sheet 29 intended to be suctioned by the suction nozzle 38, from below thereof when the die 22 is suctioned by the suction nozzle 38 of the supply head 33. The protrusion 42 moves upward and downward in association with the up-down movement of the stage 32.

Figure 5:
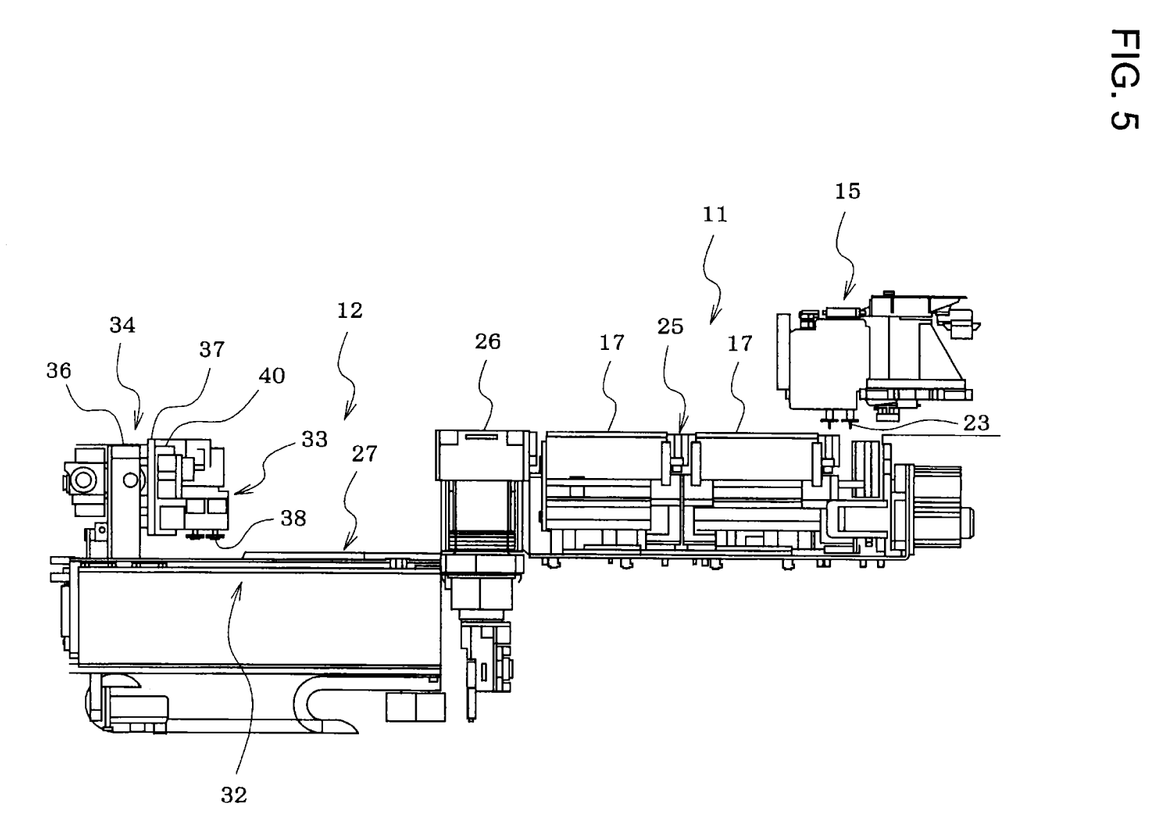
FIG. 5 is a side view illustrating a positional relationship in height between the supply head and the mounting head of the component mounting machine when the stage of the die supply apparatus is lowered.
Figure 6:
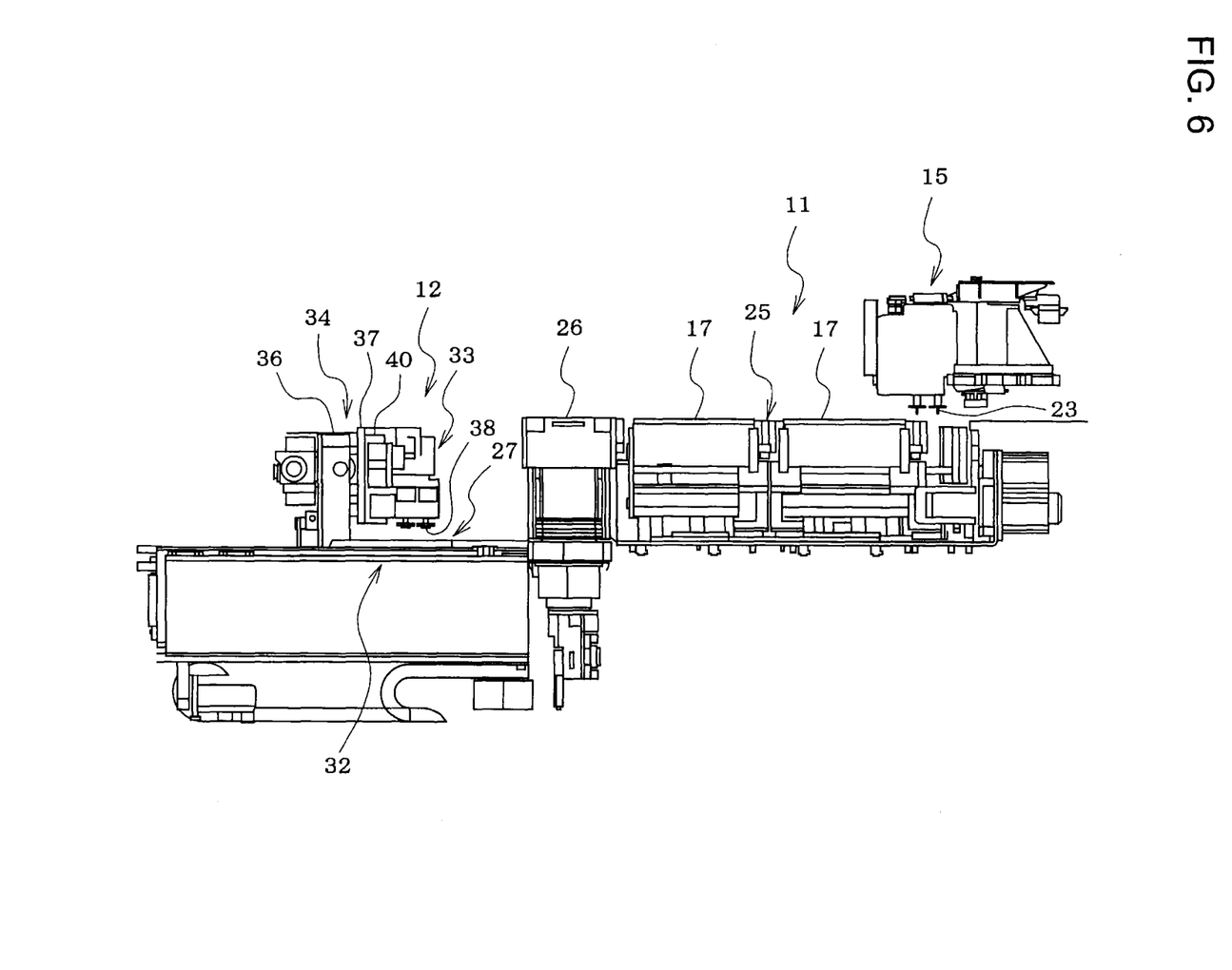
FIG. 6 is a side view illustrating a state occurring when a die of a wafer pallet on the stage of the die supply apparatus is suctioned by the supply head.

While the component mounting machine 11 is in operation, a control device (not illustrated) controls the operations of the component mounting machine 11, the die supply apparatus 12, and the feeder in accordance with a production job (a production program). Then, any one of the die 22 supplied from the die supply apparatus 12 and the feeder component supplied from the feeder is suctioned and mounted on the circuit board 17. In this case, when the die 22 is inverted upside down and mounted on the circuit board 17, the supply head 33 of the die supply apparatus 12 and the stage 32 are lowered as illustrated in FIG. 5, and the supply head 33 is moved to be positioned over the wafer pallet 27 as illustrated in FIG. 6. Before the die 22 is suctioned by the supply head 33, the camera 41 images the die 22 so as to recognize the position of the die 22. Then, the die 22 is suctioned by the suction nozzle 38 of the supply head 33. Thereafter, as illustrated in FIG. 7, the supply head 33 of the die supply apparatus 12 is inverted upside down so as to cause the die 22 suctioned by the suction nozzle 38 to be inverted upside down, and the mounting head 15 of the component mounting machine 11 is moved to be positioned over the supply head 33. Then, the die 22 on the suction nozzle 38 of the supply head 33 is suctioned by the suction nozzle 23 of the mounting head 15 and is mounted on the circuit board 17.

The number of nozzles of the mounting head 15 (the number of the suction nozzles 23) of the component mounting machine 11 is not fixed, and there is a component mounting machine having a different number of nozzles. Moreover, there is also a component mounting machine in which the mounting head 15 of the component mounting machine 11 is replaceable with a mounting head having a different number of nozzles (the number of the suction nozzles 38). In this case, if the number of nozzles of the supply head 33 of the die supply apparatus 12 does not coincide with the number of nozzles of the mounting head 15 of the component mounting machine 11, the numbers of dies suctionable between the supply head 33 of the die supply apparatus 12 and the mounting head 15 of the component mounting machine 11 do not coincide with each other. Therefore, delivery of the die 22 from the die supply apparatus 12 to the component mounting machine 11 cannot be efficiently performed, thereby degrading tact time in production.

In the configuration of Example 1, the supply head 33 of the die supply apparatus 12 is detachably held by the head holding unit 40 of the head moving mechanism 34, and the supply head 33 held by the head holding unit 40 is replaceable with a supply head which has the same number of nozzles as the number of nozzles of the mounting head 15 of the component mounting machine 11. Moreover, a nozzle arrangement (an arrangement of the suction nozzle 38) of the supply head 33 of the die supply apparatus 12 is caused to be the same arrangement as a nozzle arrangement (an arrangement of the suction nozzle 23) of the mounting head 15 of the component mounting machine 11.

Before starting production (before the component mounting machine 11 is operated), a worker checks whether the number of nozzles of the supply head 33 of the die supply apparatus 12 coincides with the number of nozzles of the mounting head 15 of the component mounting machine 11. If both the numbers of nozzles do not coincide with each other, the supply head 33 of the die supply apparatus 12 is replaced with a supply head which has the same number of nozzles as the number of nozzles of the mounting head 15 of the component mounting machine 11, and then, production starts. In this manner, the numbers of suctionable dies can coincide with each other by causing the numbers of nozzles to coincide with each other between the supply head 33 of the die supply apparatus 12 and the mounting head 15 of the component mounting machine 11.

Moreover, in Example 1, since the nozzle arrangement of the supply head 33 of the die supply apparatus 12 is caused to be the same arrangement as the nozzle arrangement of the mounting head 15 of the component mounting machine 11, a plurality of the dies 22 which are respectively suctioned by a plurality of the suction nozzles 38 of the supply head 33 of the die supply apparatus 12 can be simultaneously delivered to a plurality of the suction nozzles 23 of the mounting head 15 of the component mounting machine 11. Therefore, delivery of the dies 22 from the die supply apparatus 12 to the component mounting machine 11 can be efficiently performed, and thus, tact time in production can be improved.

In Example 1, replacement of the supply head 33 of the die supply apparatus 12 is performed by a worker. However, the supply head 33 may be configured to be automatically replaced.

When the supply head 33 is automatically replaced, a head placement portion 100 for placing a supply head for replacement may be provided in the die supply apparatus 12, and the control device (not illustrated) of the die supply apparatus 12 may control the head moving mechanism 34 so as to cause the supply head on the head placement portion to be held by the head holding unit 40. In this manner, the supply head 33 of the die supply apparatus 12 can be automatically replaced.

Example 2

Figure 12:
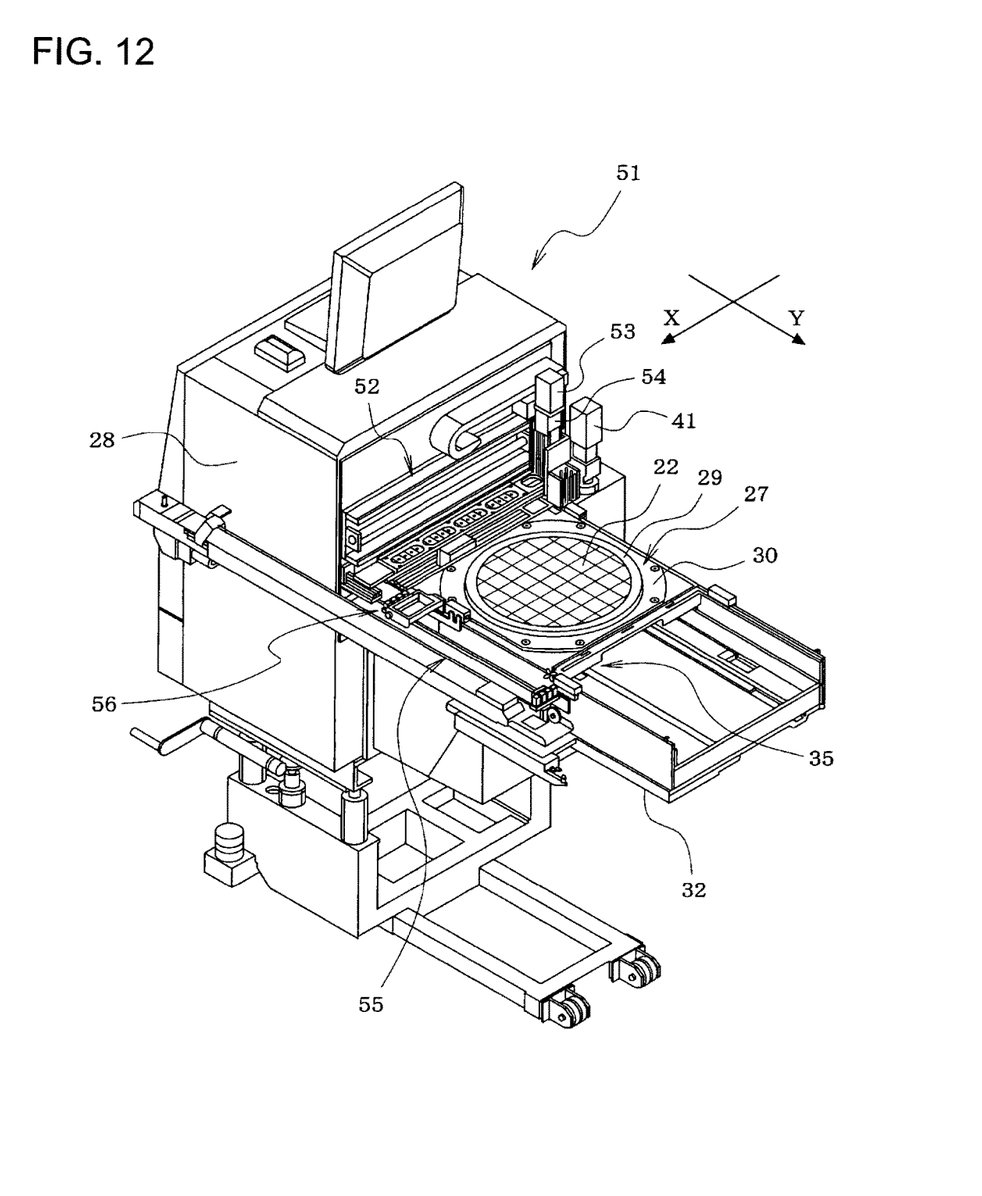
FIG. 12 is a perspective view illustrating the die supply apparatus of Example 2 of the present disclosure.

Subsequently, descriptions will be given regarding Example 2 in which the present disclosure is specified by being applied to the die supply apparatus adopting a shuttle delivery method, with reference to FIG. 12. However, descriptions are omitted or simplified by applying the same reference numerals to the portions substantially the same as those in Example 1. Thus, descriptions will be given mainly regarding portions different from those in Example 1.

A head moving mechanism 52 of a die supply apparatus 51 is provided to be positioned above a drawing-out port of the wafer pallet 27 in a rear face portion of the magazine 28. In Example 2, a movement direction of the head moving mechanism 52 is set to only the X-direction, and a relative position of the head moving mechanism 52 in the Y-direction (a pallet drawing-out direction) with respect to the wafer pallet 27 is controlled by the drawing-out mechanism 35 by gradually drawing out the wafer pallet 27 in the Y-direction.

A supply head 54 provided with one or the plurality of suction nozzles (not illustrated) facing downward is detachably held by a head holding unit 53 which is moved in the X-direction by the head moving mechanism 52. The supply head 54 held by the head holding unit 53 is configured to be replaceable with a supply head which has the same number of nozzles as the number of nozzles of the mounting head 15 of the component mounting machine 11, and the nozzle arrangement of a supply head 54 is caused to be the same arrangement as the nozzle arrangement of the mounting head 15 of the component mounting machine 11.

The die supply apparatus 51 is provided with a shuttle mechanism 55. The shuttle mechanism 55 receives the die 22 suctioned by the suction nozzle of the supply head 54 and transfers the die 22 to a die delivery position so as to be suctionable by the suction nozzle 23 of the mounting head 15 of the component mounting machine 11. In Example 2, the shuttle mechanism 55 is configured to transfer the plurality of dies 22 so as to cause the arrangement of the dies 22 at the die delivery position to be the same arrangement as the nozzle arrangement of the mounting head 15 of the component mounting machine 11. The shuttle mechanism 55 is also configured to allow the plurality of dies 22 at the die delivery position to be simultaneously suctioned by a plurality of the suction nozzles 23 of the mounting head 15 of the component mounting machine 11.

The shuttle mechanism 55 is provided with an inversion unit 56 by which the die 22 received from the supply head 54 is inverted upside down as necessary. This is because there exists a die which is inversely attached to the dicing sheet 29 of the wafer pallet 27 (for example, a flip chip), depending on types of the dies 22.

Before starting production (before the component mounting machine 11 is operated), a worker checks whether the number of nozzles of the supply head 54 of the die supply apparatus 51 coincides with the number of nozzles of the mounting head 15 of the component mounting machine 11. If both the numbers of nozzles do not coincide with each other, the supply head 54 of the die supply apparatus 51 is replaced with a supply head which has the same number of nozzles as the number of nozzles of the mounting head 15 of the component mounting machine 11, and then, production starts. In this manner, the numbers of suctionable dies can coincide with each other by causing the numbers of nozzles to coincide with each other between the supply head 54 of the die supply apparatus 51 and the mounting head 15 of the component mounting machine 11.

Moreover, in Example 2, since the arrangement of the dies 22 which are transferred to the die delivery position by the shuttle mechanism 55 is caused to be the same arrangement as the nozzle arrangement of the mounting head 15 of the component mounting machine 11, the plurality of dies 22 which are transferred to the die delivery position by the shuttle mechanism 55 can be simultaneously delivered to the plurality of suction nozzles 23 of the mounting head 15 of the component mounting machine 11. Therefore, delivery of the dies 22 from the die supply apparatus 51 to the component mounting machine 11 can be efficiently performed, and thus, tact time in production can be improved.

In Example 2, replacement of the supply head 54 of the die supply apparatus 51 is performed by a worker. However, the supply head 54 may be configured to be automatically replaced.

When the supply head 54 is automatically replaced, the head placement portion for placing a supply head for replacement may be provided in the die supply apparatus 51, and the control device (not illustrated) of the die supply apparatus 51 may control the head moving mechanism 52 so as to cause the supply head on the head placement portion to be held by the head holding unit 53. In this manner, the supply head 54 of the die supply apparatus 51 can be automatically replaced.

The present disclosure is not limited to Examples 1 and 2 described above. It is needless to mention that various changes and modifications can be made and provided without departing from the scope of the present disclosure. For example, the configurations of the component mounting machine 11 and the die supply apparatuses 12 and 51 may be appropriately changed.

REFERENCE SIGNS LIST

11 . . . COMPONENT MOUNTING MACHINE, 12 . . . DIE SUPPLY APPARATUS, 13 . . . FEEDER SETTING

TABLE, 15 . . . MOUNTING HEAD, 16 . . . XY-MOVING MECHANISM, 17 . . . CIRCUIT BOARD, 22 . . . DIE, 23 . . . SUCTION NOZZLE, 25 . . . CONVEYOR, 26 . . . COMPONENT CAMERA, 27 . . . WAFER PALLET, 28 . . . MAGAZINE, 29 . . . DICING SHEET, 32 . . . STAGE, 33 . . . SUPPLY HEAD, 34 . . . HEAD MOVING MECHANISM, 35 . . . DRAWING-OUT MECHANISM, 38 . . . SUCTION NOZZLE, 39 . . . UPSIDE-DOWN INVERTING MECHANISM, 40 . . . HEAD HOLDING UNIT, 41 . . . CAMERA, 42, . . . PUSHING UP MECHANISM PROTRUSION, 51 . . . DIE SUPPLY APPARATUS, 52 . . . HEAD MOVING MECHANISM, 53 . . . HEAD HOLDING UNIT, 54 . . . SUPPLY HEAD, 55 . . . SHUTTLE MECHANISM

The invention claimed is:

1. A component mounting machine, comprising:
a mounting head holding at least one mounting nozzle;
a head moving mechanism which moves the mounting head;
a die supply apparatus having a supply head and a supply head moving mechanism;
a stage which holds a wafer pallet holding a dicing sheet; and
a protrusion which pushes up at least one die which is formed from a portion of the dicing sheet,
wherein
the supply head holds at least one supply nozzle,
the supply head moving mechanism moves the supply head in a first axis direction and a second axis direction in a horizontal plane,
the supply head moving mechanism detachably holds the supply head,
the supply head is rotatable relative to the supply head moving mechanism,
the supply head supplies the at least one die suctioned by the at least one supply nozzle to the at least one mounting nozzle,
a position of the supply head, the supply head moving mechanism, and the stage is lifted by the die supply apparatus so that the at least one supply nozzle of the supply head picks up the least one die from the wafer in a first orientation of the supply head, and
the position of the supply head, the supply head moving mechanism, and the stage is lowered by the die supply apparatus so that the at least one mounting nozzle of the mounting head picks up the at least one die from the supply head in a second orientation of the supply head which is inverted from the first orientation of the supply head so that the supply head supplies the die suctioned by the at least one supply nozzle to the at least one mounting nozzle.

2. The component mounting machine according to claim 1,
wherein a nozzle arrangement of the supply head is configured to be a same arrangement as a nozzle arrangement of the mounting head so as to allow a plurality of the dies which are respectively suctioned by a plurality of supply nozzles of the supply head to be simultaneously suctioned by a plurality of mounting nozzles of the mounting head.

3. The component mounting machine according to claim 1, further comprising:
a shuttle mechanism that receives the at least one die which is suctioned by the at least one supply nozzle of the supply head and transfers the at least one die to a die delivery position so as to be suctionable by the at least one mounting nozzle of the mounting head,
wherein the shuttle mechanism is configured to transfer a plurality of dies so as to cause a die arrangement at the die delivery position to be a same arrangement as a nozzle arrangement of the mounting head and to allow the plurality of dies at the die delivery position to be simultaneously suctioned by the plurality of nozzles of the mounting head.

4. The component mounting machine according to claim 1, further comprising:
a head placement portion in which a supply head for replacement is placed.

5. The component mounting machine according to claim 1, wherein the protrusion moves vertically in association with vertical movement of the stage.

6. The component mounting machine according to claim 1, wherein the supply head and the stage move up and down integrally.

* * * * *